(12) United States Patent
Yoshida et al.

(10) Patent No.: US 6,734,706 B2
(45) Date of Patent: May 11, 2004

(54) CIRCUIT FOR DRIVING A POWER DEVICE

(75) Inventors: Hiroshi Yoshida, Fukuoka (JP); Yoshikazu Tanaka, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 72 days.

(21) Appl. No.: 10/252,694

(22) Filed: Sep. 24, 2002

(65) Prior Publication Data

US 2003/0179020 A1 Sep. 25, 2003

(30) Foreign Application Priority Data

Mar. 19, 2002 (JP) ........................................ 2002-075868

(51) Int. Cl.[7] ................................................. H03K 3/00
(52) U.S. Cl. ........................... 327/108; 327/90; 327/112
(58) Field of Search .............................. 327/82, 90, 112, 327/108, 170; 326/82, 83, 84, 86, 87

(56) References Cited

U.S. PATENT DOCUMENTS 4,638,187 A  *  1/1987  Boler et al. .................... 326/27
5,396,108 A  *  3/1995  McClure ...................... 327/108
5,889,707 A  *  3/1999  Yang ........................ 365/189.05

* cited by examiner

Primary Examiner—Tuan T. Lam
Assistant Examiner—Hiep Nguyen
(74) Attorney, Agent, or Firm—Oblon, Spivak, McClelland, Maier & Neustadt, P.C.

(57) ABSTRACT

A driving circuit includes a level shift circuit that shifts and outputs the level of the main signals consisting of the "ON" and "OFF" signals that respectively instruct ON and OFF of the power device, a transmitter circuit that latches the main signals to transmit to the power device, a mask signal circuit that generates a mask signal based on the main signals to prevent the transmission of the main signals when the logic of the "ON" and "OFF" signals becomes the same to cause false operation, a potential difference adding circuit that gives a potential difference $\Delta V$ between a signal as the main signal input to the mask signal circuit and a signal as the main signal input to the transmitter circuit.

12 Claims, 6 Drawing Sheets

*Fig.1*

*Fig.2A* LEVEL SHIFTED OUTPUT

*Fig.2B* MAIN SIGNAL

*Fig.2C* MASK SIGNAL

*Fig.2D* LATCH INPUT SIGNAL

Fig.10A PRIOR ART — LEVEL SHIFTED OUTPUT

Fig.10B PRIOR ART — MAIN SIGNAL

Fig.10C PRIOR ART — MASK SIGNAL

Fig.10D PRIOR ART — LATCH INPUT SIGNAL

FALSE SIGNAL

CIRCUIT FOR DRIVING A POWER DEVICE

BACKGROUND OF THE INVENTION

1. Field of the Invention

The present invention relates to a circuit for driving a power device, and particularly to a technology operable to prevent false operation of the high potential side output associated with an false signal due to the negative noise and the like at the high potential side reference potential.

2. Description of the Related Art

Figure 9:
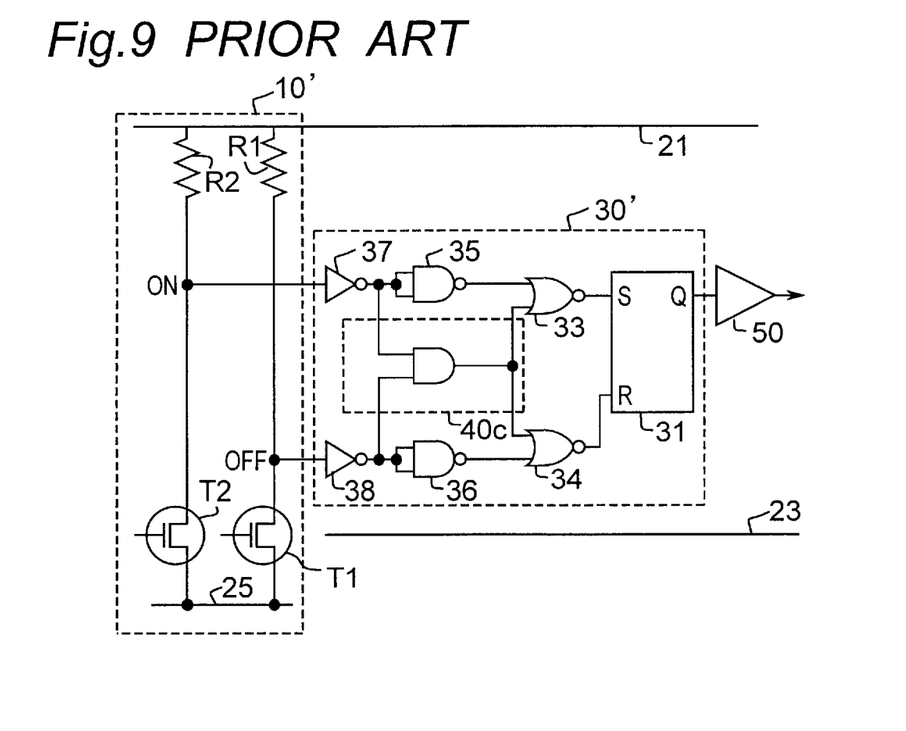
FIG. 9 is a drawing illustrating a configuration of driving circuit for power devices in prior art.

FIG. 9 shows a configuration of a prior driving circuit for power devices. The driving circuit is connected to a power device such as the IGBT and MOSFET (not illustrated), and used to generate a control signal to drive the power devices. Such the driving circuit is described below.

The driving circuit illustrated in FIG. 9 is equipped with a level shift circuit 10', a transmitter circuit 30', and a driver circuit 50. The level shift circuit 10' includes resisters R1 and R2, high-voltage field effect transistors (hereafter called "HNMOS transistor") T1 and T2. The transmitter circuit 30' has an RS flip-flop 31, NOR gates 33 and 34, NAND gates 35 and 36, inverter gates 37 and 38, and a mask signal circuit 40c including an AND gate. The driver circuit 50 is connected to a power device such as the IGBT and MOSFET, and its output signal controls the driving of the power device.

A signal on the high potential side that controls the ON and OFF operation of the power device is fed into the level shift circuit 10'. The high potential side signal is a square wave signal, and is fed to the HNMOS transistors T1 and T2 of the level shift circuit 10' such that a level of the high potential side signal is shifted to a high potential. The level-shifted signals (hereafter referred to "ON signal" and "OFF signal") are transmitted from the driver circuit 50 to the power device through the inverter gates 37 and 38 of the transmitter circuit 30'.

In general, a load of the power device driven by the driving circuit can be an inductive load of a motor or a fluorescent lamp. Owing to an influence of such an inductive load and parasitic inductance components of wiring on a printed circuit board, the high potential side reference potential (potential at the grounding line 23) in the driving circuit fluctuates to the negative side of the ground (potential at the grounding line 25) during switching, so that the high potential side signal becomes false by this fluctuation. The false signal can be generated by dv/dt applied to the high potential side reference potential or by a large negative noise level in the high potential side reference potential.

The false signal causes a current to flow through level shift resistors R1 and R2 connected to the high potential side power supply 21 by parasitic capacitance or parasitic diodes of the HNMOS transistors T1 and T2, and the like, thereby causing a voltage drop. Then the false signal is transmitted to the transmitter circuit 30', resulting in false operation of the power device.

The circuit illustrated in FIG. 9 uses a logic filter technique to counteract the false operation. That is, the circuit has a mask signal circuit 40c that generates a signal that cancels the false signal. The mask signal circuit 40c generates a signal (called "mask signal" hereafter) that masks the "ON" and "OFF" signals so that these signals are not transmitted to the RS flip-flop 31 if they are both active. The mask signal masks the "ON" and "OFF" signals input to the transmitter circuit 31, that is, output signals (called "main signals" hereafter) of the NAND gates 35 and 36. At this time, the operation ranges of the main signals and the mask signal are set to the same. However when their operation ranges are dispersed, the false signal may be transmitted to the transmitter circuit 31. We now describe this situation referring to FIG. 10.

Figure 10A:
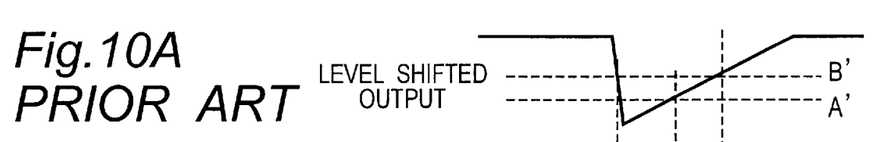
FIG. 10A is a drawing illustrating a waveform of the output signal of the level shift circuit in the driving circuit in prior art.
Figure 10B:
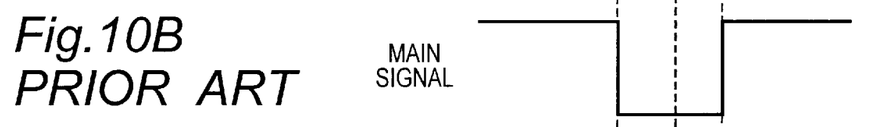
FIG. 10B is a drawing illustrating a waveform of the main signals (NAND gates outputs) in the driving circuit in prior art.
Figure 10C:
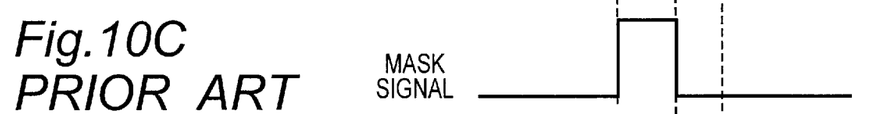
FIG. 10C is a drawing illustrating a waveform of the mask signal in the driving circuit in prior art.
Figure 10D:
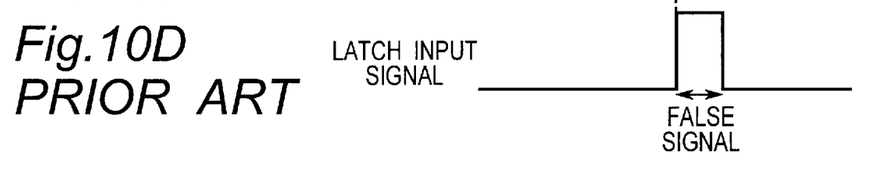
FIG. 10D is a drawing illustrating a waveform of the input signal to the transmitter circuit in the driving circuit in prior art.

For example, suppose the case where the outputs of level shift circuit 10', that is, the "ON" and "OFF" signals rapidly decline by the influence of dv/dt and the like as shown in FIG. 10A. Also suppose that the level of the threshold values of the NAND gates 35 and 36 and the level of the threshold value for the mask signal circuit 40c are different by dispersion and the like. In FIG. 10A, the threshold values for the NAND gates 35 and 36 is illustrated by the broken line B' and the level of the threshold value for the mask signal circuit 40c is illustrated by the broken line A'. In this case, the main signals and the mask signal respectively vary as shown in FIGS. 10B and 10C. More particularly, the range where the mask signal is active (i.e. HIGH) becomes narrower than the range where the main signals become inactive (i.e. LOW), so that a main signal that becomes falsely inactive, i.e. a false signal, can not be sufficiently masked. Therefore, a false signal occurs in a latch input signal which is a set input signal of the RS flip-flop 31, as shown in FIG. 10D.

SUMMARY OF THE INVENTION

The present invention is aimed to solve the above problem, and its object is thus to provide a driving apparatus for driving power devices operable to securely prevent an false signal due to negative noise, dv/dt and the like on the high potential side reference potential from occurring.

A driving circuit according to the present invention is a circuit for driving a power device including level shift circuit that shifts levels of main signals comprising ON and OFF signals that respectively instruct ON and OFF of the power device and outputs the shifted signals, transmitter circuit that latches the main signals to transmit to the power device, mask signal circuit that generates a mask signal based on the main signals, the mask signal preventing the main signals from transmitting when the logic of the "ON" and "OFF" signals becomes the same to cause false operation, and potential difference adding circuit that provides a potential difference between a signal as the main signal fed to the mask signal circuit and a signal as the main signal fed to the transmitter circuit. Therefore, the operation range of the mask signal is enlarged, and the false signal can be masked more securely, so that the occurrence of the false signal can be securely prevented.

In the driving circuit, the mask signal circuit may generate a mask signal to cancel one of the main signals from a signal obtained by inverting the other of the main signals. Therefore, it does not require to adjust with high precision threshold values, delay time, and so on of logic gate elements involved in the mask signal path and the main signals path, so that design efficiency can be improved. Further, the signal circuits can be simplified.

Further, the potential-difference adding circuit may include a resistor element, and bias current can be reduced by appropriately determining the resistance value of the resistor element. Therefore, a heat loss which is a latent problem in driving circuits can be improved.

Further, the potential-difference adding circuit may include a PMOS transistor, and the threshold voltage can be increased by using the back-gate effect. In that case, there is an advantage when the potential difference ΔV is set at a large value.

Further, the potential-difference adding circuit may include an NMOS transistor. In that case, the potential difference ΔV is less affected by current, so that the potential-difference value becomes more stable. Therefore, the operation range of the main signals and the operation range of the mask signal can be stably separated.

Further, the potential-difference adding circuit may include a diode. In that case, the value of the potential difference ΔV can be more finely set with a plurality of stages of diodes.

Further, the potential-difference adding circuit may include a Zener diode. In that case, a large value of the potential difference ΔV can be obtained with a single-stage of Zener diode, so that the layout area can be reduced.

BRIEF DESCRIPTION OF THE DRAWINGS

The present invention will become readily understood from the following description of preferred embodiments thereof made with reference to the accompanying drawings, in which like parts are designated by like reference numerals and in which.

DESCRIPTION OF THE PREFERRED EMBODIMENTS

In the following, preferred embodiments of the driving circuit for power devices according to the present invention are described in details with reference to accompanied figures.

First Embodiment

Figure 1:
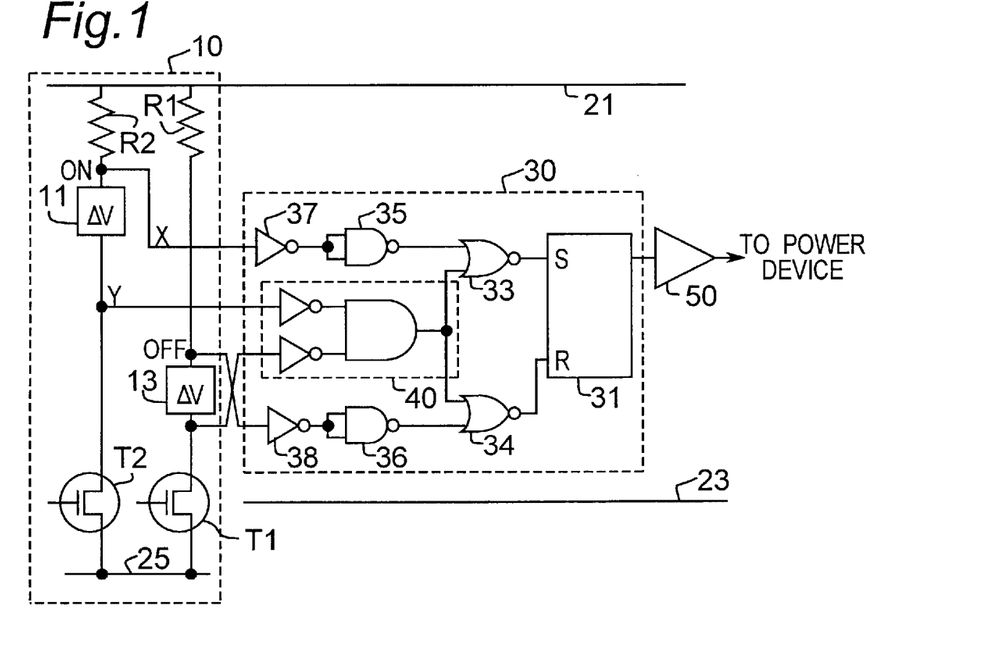
FIG. 1 is a drawing illustrating the configuration of a driving circuit for power devices of the first embodiment according to the present invention.

FIG. 1 illustrates a configuration of a circuit for driving a power device according to the present invention. The driving circuit is a circuit that generates a driving signal for the power device, and has a level shift circuit 10, a transmitter circuit 30, and a driver circuit 50. The driving circuit can be constructed of a high-voltage integrated circuit (HVIC).

The level shift circuit 10 includes resistors R1 and R2, high-voltage field effect transistors (HNMOS transistors) T1 and T2. Potential-difference adding circuits 13 or 11 is connected between the resistor R1 and the HNMOS transistor T1 or between the resistor R2 and the HNMOS transistor T2, respectively. The potential-difference adding circuit 11 or 13 generates a potential difference ΔV across itself.

A high potential side signal for instructing the ON and OFF operation of the power device is fed to the level shift circuit 10. The high potential side signal is a square wave signal and fed to the HNMOS transistors T1 and T2 of the level shift circuit 10, thus to be level-shifted to a high potential. Hereafter, the level-shifted high-potential signal for controlling the power device to ON is referred to "ON signal", and the level-shifted high-potential signal for controlling the power device to OFF is referred to "OFF signal". Also, the ON and OFF signals combined together are called "main signals". The main signals transmitted from the level shift circuit 10 are transmitted from the driver circuit 50 to the power device through the inverter gates 37 and 38 and the like of the transmitter circuit 30. The high potential side signal turns the HNMOS transistor T2 ON, when the power device should be turned on (the ON signal is active). The high potential side signal turns the HNMOS transistor T1 ON, when the power device should be turned off (the "OFF" signal is active).

The transmitter circuit 30 includes an RS flip-flop 31, NOR gates 33 and 34, NAND gates 35 and 36, inverter gates 37 and 38, and a mask signal circuit 40. The mask signal circuit 40 has inverters and an AND gate. The inverter gates 37 and 38 of the transmitter circuit 30 are respectively connected to the high potential side ends of the potential-difference adding circuits 11 and 13 of the level shift circuit 10. The inputs of the inverter gates of the mask signal circuit 40 are respectively connected to the low potential side ends of the potential-difference adding circuits 11 and 13.

The mask signal circuit 40 is a circuit that generates, when the "ON" and "OFF" signals become active at the same time, a mask signal that prevents the main signals from transmitting to the RS flip-flop 31. The reason is that the RS flip-flop 31 operates falsely if these main signals are transmitted as they are.

In the transmitter circuit 30, the NOR gate 33 performs the NOR operation with the ON signal (main signal) input from the level shift circuit 10 through the inverter gate 37 and the NAND gate 35 on the one hand and the mask signal generated by the mask signal circuit 40, and then transmits the operation result to the set input (S) of the RS flip-flop 31. The NOR gate 34 performs the NOR operation with the "OFF" signal input from the level shift circuit 10 through the inverter gate 38 and the NAND gate 36 on the one hand and the mask signal generated by the mask signal circuit 40, and then transmits the operation result to the reset input (R) of the RS flip-flop 31.

More particularly, in the above driving circuit, the inputs of the mask signal circuit 40 are connected to the low potential sides of the potential-difference adding circuits 11 and 13, and the inputs of the transmitter circuit 30 are connected to the high potential sides of the potential-difference adding circuits 11 and 13. By this means, when the main signals fluctuate with dV/dt, a voltage less than the main signals input to the transmitter circuit 30 by ΔV is input to the mask signal circuit 40, so that the operation range of the mask signal circuit 40 is enlarged wider than the ranges of the NAND gates 35 and 36. Accordingly, the false signal can be more securely masked even if the threshold values of the inverter gates and the like are dispersed, thereby preventing occurrence of the false signal.

Figure 2A:
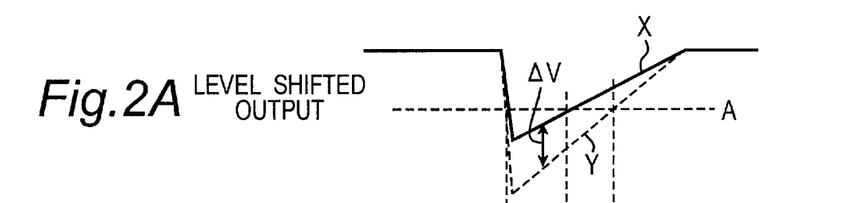
FIG. 2A is a drawing illustrating a waveform of the output signal of the level shift circuit in the driving circuit according to the present invention.
Figure 2B:
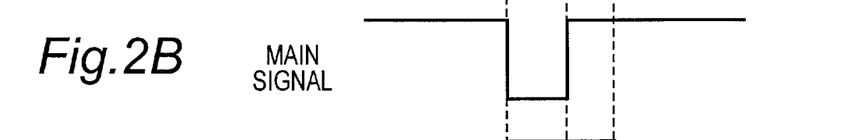
FIG. 2B is a drawing illustrating a waveform of the main signals (NAND gates outputs) in the driving circuit according to the present invention.
Figure 2C:
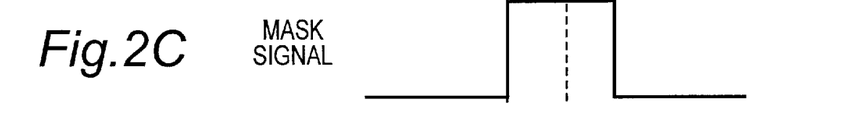
FIG. 2C is a drawing illustrating a waveform of the mask signal in the driving circuit according to the present invention.
Figure 2D:
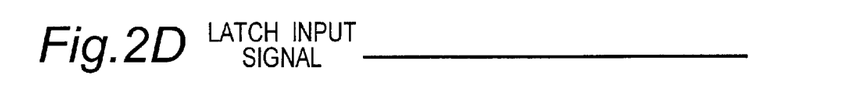
FIG. 2D is a drawing illustrating a waveform of the input signal to the transmitter circuit in the driving circuit according to the present invention.

The operation of this process is described more specifically in the following with reference to FIGS. 2A to 2D. In FIG. 2A, the line X represents a change in the outputs (the main signals) of the level shift circuit 10 that have rapidly declined by the influence of dv/dt and the like. The broken line Y represents a change in the input signals for the mask signal circuit 40 at that time. The broken line A represents the threshold level for logical inversion of the inverter gates in the mask signal circuit 40 and the transmitter circuit 30. As shown in FIG. 2A, the input signal (broken line Y) to the mask signal circuit 40 varies at a level lower by the potential difference ΔV than the potential of the input signal (line X) to the transmitter circuit 30. Therefore, the range (operation range) where the mask signal is active is enlarged. The main signals which are the outputs of the NAND gates 35 and 36 vary as shown in FIG. 2B, while the mask signal varies as shown in FIG. 2C. In this way, the range (operation range) where the mask signal is active is enlarged, so that the main signals containing a fluctuation component which may generate a false signal can be sufficiently masked. As a result, as shown in FIG. 2D, a false signal does not occur in the latch input signal which is fed to the set input (S) of the RS flip-flop 31.

As described above, in the present embodiment, the potential of the input signals for generating the mask signal is made lower than the potential of the main signals that control the driving of the power device. Thus, the masking of the false signal is secured to prevent the false signal from occurring. The potential difference ΔV is set at a value such that the masking can be performed sufficiently even if qualities of the circuit elements disperse.

Second Embodiment

Figure 3:
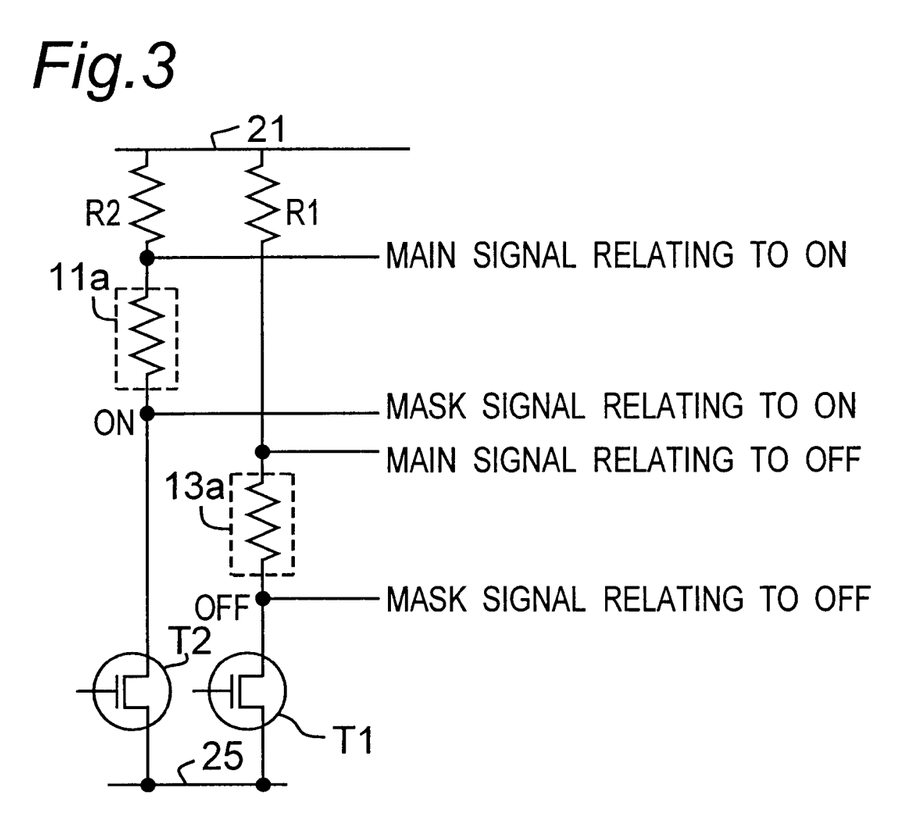
FIG. 3 is a drawing illustrating an example of the potential-difference adding circuits in the driving circuit that has resistor elements (second embodiment)

FIG. 3 illustrates an example in which the potential-difference adding circuits 11 and 13 in the driving circuit of the first embodiment include resistor elements. Here, the potential difference ΔV is obtained as a product of the resistance value of the resistor elements 11a and 13a and a bias current. Appropriate determined resistance value of the resistor elements 11a and 13a can reduce the bias current, and thus a problem relating to a heat loss which is a latent problem in the present driving circuit can be improved. It is noted that the potential-difference circuits 11 and 13 includes not only one stage of resistor element but also two or more stages of resistor elements.

Third Embodiment

Figure 4A:
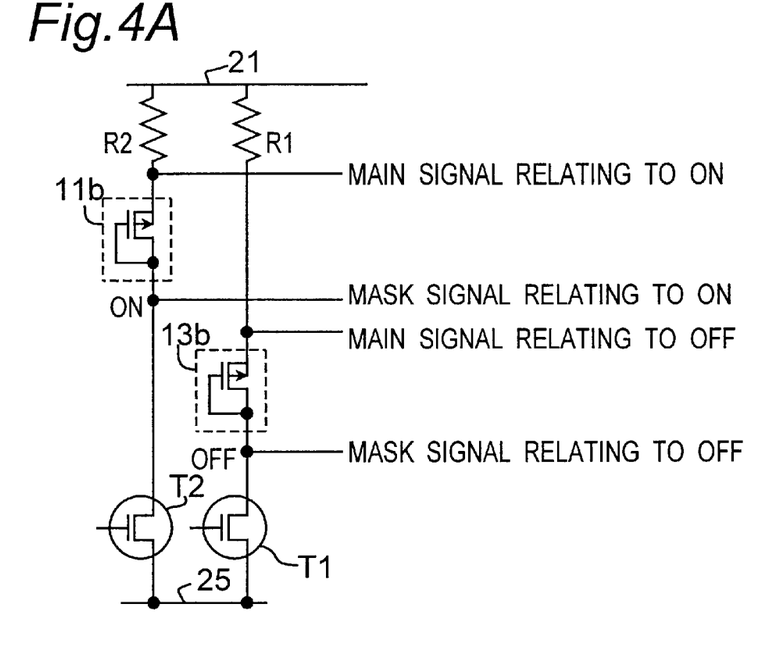
FIG. 4A is a drawing illustrating an example of the potential-difference adding circuits in the driving circuit that has PMOS transistors (third embodiment)
Figure 4B:
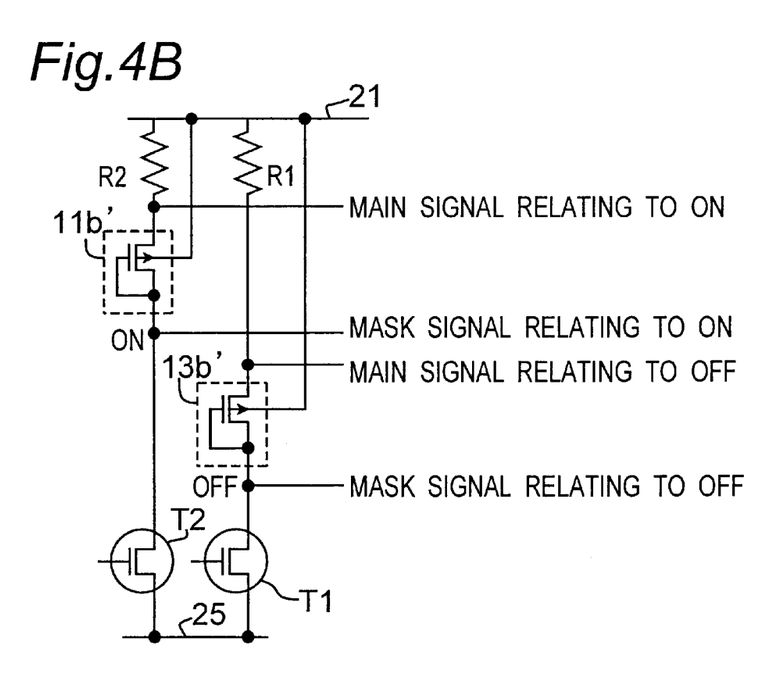
FIG. 4B is a drawing illustrating an example of the potential-difference adding circuits in the driving circuit that has PMOS transistors of which back-gate effect is utilized (third embodiment)

FIGS. 4A and 4B illustrate examples in which the potential-difference adding circuit 11 or 13 in the driving circuit of the first embodiment includes PMOS transistor. In the potential-difference adding circuit 11b or 13b shown in FIG. 4A, a back-gate terminal of the PMOS transistor is connected to a source terminal so that their potentials can be the same. The potential difference ΔV is obtained as the threshold voltage Vth of the PMOS transistor 11b or 13b. FIG. 4B illustrates an example in which the back-gate effect of PMOS is utilized. A back-gate terminal of the PMOS transistor and a source terminal are connected through the register so that a potential difference can be obtained between them. In this case, unlike the case of FIG. 4A, the threshold voltage Vth increases by the potential difference between the back-gate terminals and the source terminals, and therefore the potential difference ΔV given by the potential-difference adding circuits 11b' and 13b' also increases by the same amount.

Fourth Embodiment

Figure 5:
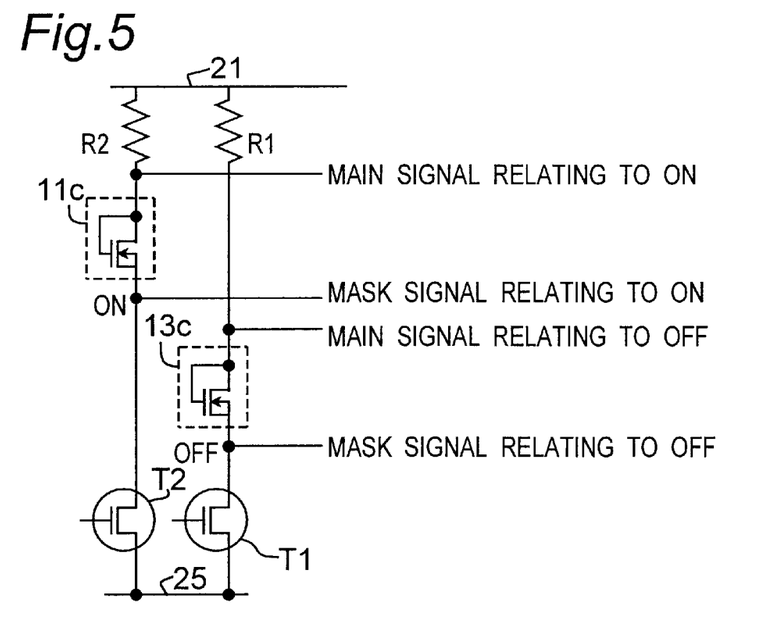
FIG. 5 is a drawing illustrating an example of the potential-difference adding circuits in the driving circuit having NMOS transistors (fourth embodiment)

FIG. 5 illustrates an example of the potential-difference adding circuits 11 and 13 in the driving circuit of the first embodiment in which circuits 11 and 13 include NMOS transistors. The potential difference ΔV is obtained as the threshold voltage Vth of the NMOS transistors 11c and 13c. Therefore, the potential difference ΔV is less affected by the current value, so that it becomes more stable than in the case where resistor elements are used. Therefore, the operation range of the main signals and the operation rage of the mask signal can be stably separated.

Fifth Embodiment

Figure 6:
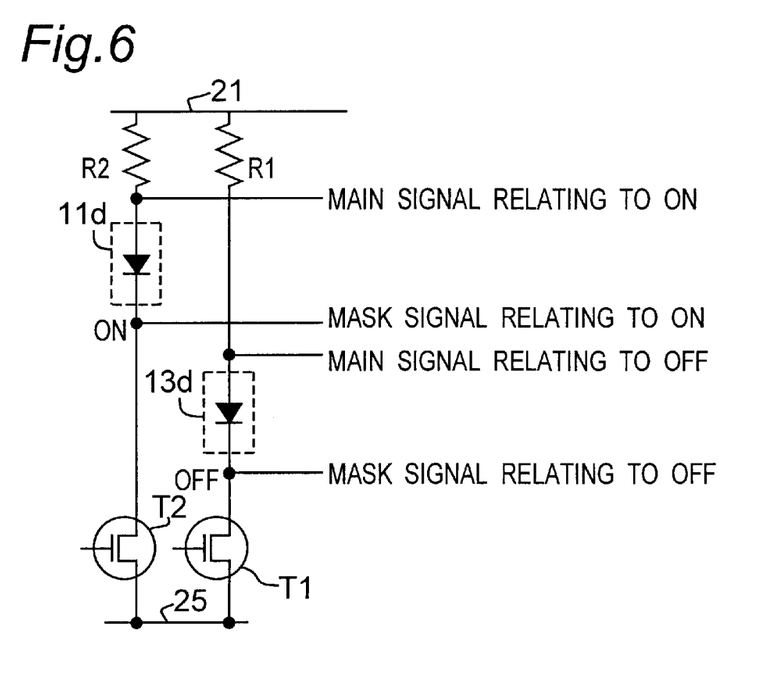
FIG. 6 is a drawing illustrating an example of the potential-difference adding circuits in the driving circuit that has diodes (fifth embodiment)

FIG. 6 illustrates an example of the potential-difference adding circuits 11 and 13 in the driving circuit of the first embodiment in which the circuits 11 and 13 includes diodes. The potential difference ΔV is obtained as the forward-voltage drop value Vf of the diodes 1id and 13d. Therefore, the forward-voltage drop value Vf is less affected by a current than in the case where MOS transistors are used, so that the stability can be improved. Also, the voltage drop value Vf for diodes is less than the one for Zener diodes. Accordingly, the value of the potential difference ΔV can be set more finely with plural stages of diodes.

Sixth Embodiment

Figure 7:
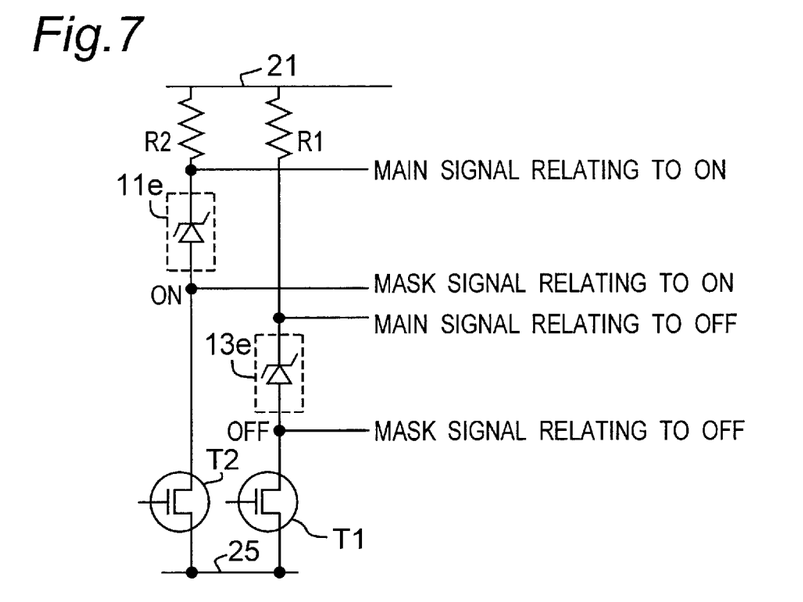
FIG. 7 is a drawing illustrating an example of the potential-difference adding circuits in the driving circuit that has Zener diodes (sixth embodiment)

FIG. 7 illustrates an example of the potential-difference adding circuits 11 and 13 in the driving circuit of the first embodiment in which the circuit 11 and 13 include Zener diodes. The voltage drop value Vf of Zener diodes is generally large. Thus, a great potential difference ΔV can be obtained from a single stage of the Zener diode 11e or 13e, and therefore the layout area can be reduced.

Seventh Embodiment

Figure 8:
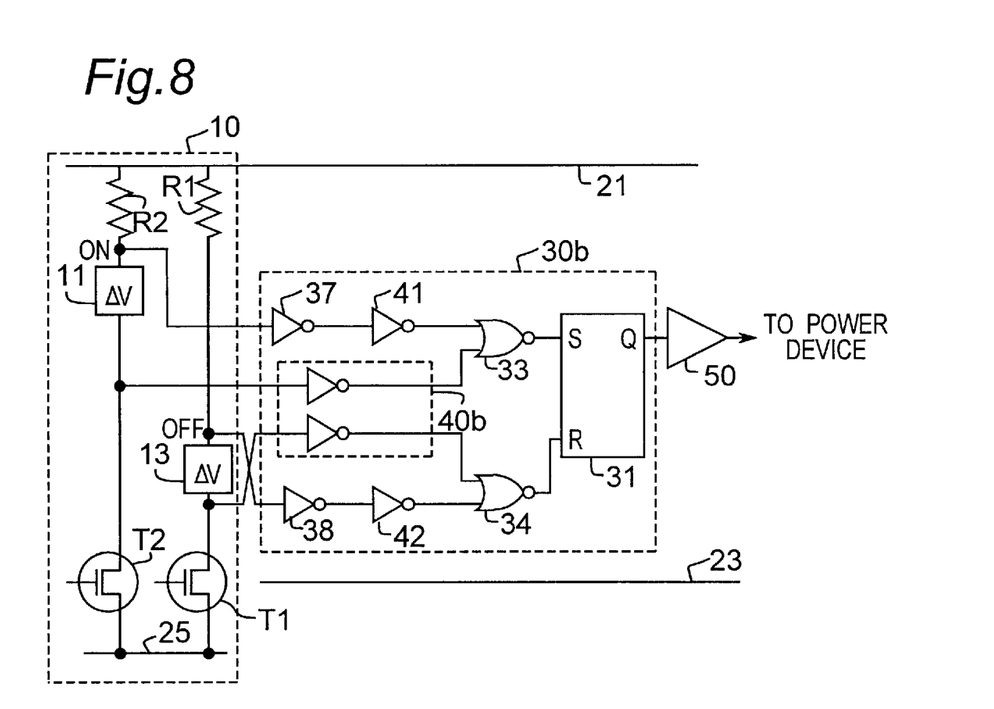
FIG. 8 is a drawing illustrating a configuration of the driving circuit for power devices in the seventh embodiment.

FIG. 8 illustrates a configuration of the driving circuit of the seventh embodiment. The driving circuit of the present embodiment differs from that of the first embodiment in that the mask signal for one of main signals is generated from the other of main signals. Therefore, the mask signal circuit 40b includes only two inverter gates 41 and 42. The present embodiment also differs in that inverter gates 41 and 42 are used in place of the NAND gates 35 and 36 in the transmitter circuit 30 of the driving circuit of the first embodiment.

The NOR gate 33 in the transmitter circuit 30b of the present embodiment masks the ON signal as the main signal with the mask signal obtained from inverting the signal tapped from the high potential side of the potential-difference adding circuit 13, which is in the half-bridge different from the one from which the ON signal is tapped. The resulting signal is then transmitted to the set input (S) of the RS flip-flop 31. The NOR gate 34 masks the "OFF" signal as the main signal with the mask signal obtained from inverting the signal tapped from the high potential side of the potential-difference adding circuit 11, which is in the half-bridge different from the one from which the "OFF" signal is tapped. The resulting signal is then transmitted to the reset input (R) of the RS flip-flop 31.

The present circuit configuration does not require high precision for adjustment of threshold values, delay time, and so on of logic gate elements involved in the mask signal path and the main signal path, so that design efficiency can be improved. Further, there is an advantage that the mask signal circuit can be configured with a smaller number of elements than in the first embodiment.

In the present embodiment, the potential-difference adding circuits 11 and 13 are provided in the level shift circuit 10 so as to make a potential of the input signals for a mask signal generation lower than that of main signals which control the driving of the power device. Thus, the false signal can be more securely cancelled.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A circuit for driving a power device comprising:
   level shift circuit that shifts levels of main signals comprising ON and OFF signals that respectively instruct ON and OFF of the power device and outputs the shifted signals;
   transmitter circuit that latches the main signals to transmit to the power device;
   mask signal circuit that generates a mask signal based on the main signals, the mask signal preventing the main signals from transmitting when the logic of the "ON" and "OFF" signals becomes the same to cause false operation; and
   potential difference adding circuit that provides a potential difference between a signal as the main signal fed to the mask signal circuit and a signal as the main signal fed to the transmitter circuit.

2. The driving circuit according to claim 1, wherein the mask signal circuit generates a mask signal to cancel one of the main signals from a signal obtained by inverting the other of the main signals.

3. The driving circuit according to claim 1, wherein the potential difference adding circuit comprises a resistor element.

4. The driving circuit according to claim 1, wherein the potential difference adding circuit comprises a PMOS transistor.

5. The driving circuit according to claim 1, wherein the potential difference adding circuit comprises an NMOS transistor.

6. The driving circuit according to claim 1, wherein the potential difference adding circuit comprises a diode.

7. The driving circuit according to claim 1, wherein the potential difference adding circuit comprises a Zener diode.

8. The driving circuit according to claim 2, wherein the potential difference adding circuit comprises a resistor element.

9. The driving circuit according to claim 2, wherein the potential difference adding circuit comprises a PMOS transistor.

10. The driving circuit according to claim 2, wherein the potential difference adding circuit comprises an NMOS transistor.

11. The driving circuit according to claim 2, wherein the potential difference adding circuit comprises a diode.

12. The driving circuit according to claim 2, wherein the potential difference adding circuit comprises a Zener diode.

* * * * *